United States Patent [19]

Comer

[11] 4,131,884
[45] Dec. 26, 1978

[54] TRIMMING CONTROL CIRCUIT FOR A DIGITAL TO ANALOG CONVERTER

[75] Inventor: Donald T. Comer, Los Gatos, Calif.

[73] Assignee: Precision Monolithics, Inc., Santa Clara, Calif.

[21] Appl. No.: 768,327

[22] Filed: Feb. 14, 1977

[51] Int. Cl.² ............................................ H03K 13/02
[52] U.S. Cl. ...................... 340/347 CC; 340/347 DA; 340/347 M
[58] Field of Search ................. 340/347 DA, 347 CC, 340/347 M

[56] References Cited

U.S. PATENT DOCUMENTS

| 3,890,610 | 6/1975 | Cahen | 340/347 CC |
| 3,940,760 | 2/1976 | Brokaw | 340/347 DA |
| 3,961,326 | 6/1976 | Craven | 340/347 DA |

OTHER PUBLICATIONS

The Engineering Staff of Analog Devices, Inc., Analog–Digital Conversion Handbook, 1972, pp. I-54 to I-63, II-40 to II-45, II-64 to II-77.
Erdi, A Precision Trim Technique for Monolithic Analog Circuits, 1975 IEEE International Solid-State Circuits Conference, Digest of Technical Papers, pp. 192, 193.

Primary Examiner—Thomas J. Sloyan
Attorney, Agent, or Firm—Poms, Smith, Lande & Glenny

[57] ABSTRACT

Novel apparatus is described for controlling the application of circuit adjustment signals to an electrical circuit device. The same device leads are used in an operating mode with input signals in a first range, and in an adjustment mode with input signals in a second range, the two ranges being mutually exclusive.

An exemplary embodiment is directed toward trimming a digital to analog converter. A plurality of trimming elements are provided with an equal number of two-terminal actuating devices, which are arranged in a matrix such that each pair of terminals is connected in circuit with a unique pair of input leads. The devices actuate their associated trimming elements in response to the application of actuating signals, exceeding a threshold level greater than the level of the binary input signals, to their respective lead pairs. The leads are thereby capable of a dual mode operation, with one mode for normal converter operation and the other mode for setting up desired trim circuits.

17 Claims, 5 Drawing Figures

TRIMMING CONTROL CIRCUIT FOR A DIGITAL TO ANALOG CONVERTER

BACKGROUND OF THE INVENTION

1. Field of the Invention

This invention relates to electrical circuit devices, and more particularly to apparatus for selectively adjusting the operating characteristics of devices such as digital to analog converters 2. Description of the Prior Art Due to slight variations in materials, environmental conditions, and the manufacturing process itself, it is impractical to manufacture many electronic circuit devices exactly to desired specifications in production quantities. Accordingly, for those devices in which manufacturing inaccuracies tend to go beyond acceptable limits, it is common to measure the device's operating characteristics at some point in the manufacturing process and adjust the circuit so as to eliminate or at least substantially reduce the measured inaccuracies. Examples in areas in which such adjustments are commonly made include trimming the output bit currents of a digital to analog converter (DAC), nulling an amplifier with the use of an external potentiometer, making frequency adjustments to active filters and voltage controlled oscillators, and modifying the logic functions of field programmable logic displays and read only memories.

In some of these applications the adjustment is made at an intermediate stage in the manufacturing process, and in others after manufacturing is completed. The problem with intermediate adjustments is that later assembly steps such as bonding and temperature sealing the device package can change the operating characteristics from their adjusted values. If no adjustments are made until the package is completely sealed however, there then arises a problem of access to the circuit. This problem has been resolved in the past by providing adjustment circuitry internal to the device package and allocating some of the package leads to this circuitry. While this effectively relieves the problem of introducing errors after adjustment is completed, in so doing it reduces the number of leads available for the basic device itself. In addition, since adjustment circuits are frequently digital in nature, the limited number of leads that can be devoted to the adjustment function restricts the range and resolution of the adjustment which can be achieved.

With respect to DAC's, various techniques are available for trimming their individual bit circuits in order to increase the accuracy of the output current signal produced by those bits. These methods include the employment of resistance networks or transistor current sources to modify the bit currents. The latter technique is described in copending patent application Ser. No. 768,328, entitled "Selectable Trimming Circuit for Use with a Digital to Analog Converter," filed on the same date as, and assigned to the assignee of the present application. It employs a plurality of current source transistors of varying magnitude for each trimmed bit, with a selectable shorting zener diode controlling the operation of each transistor. Each of the above techniques is characterized by two-terminal trimming devices which require a pair of signal inputs or connections to effect the desired trimming.

In the manufacture of integrated circuit DACs, the DAC circuit is first formed on a surface of an integrated circuit chip, lead wires are bonded on, and finally the chip is sealed to protect the circuit elements. Each of the last two steps may introduce modifications in the outputs of the bit circuits. For example, bonding on the lead wires creates mechanical stresses in the chip which can change resistance values, while the relatively high sealing temperature can introduce other variations into the circuit output. It is therefore highly desirable that trimming be accomplished after the circuit is completely packaged and final output characteristics established. This is particularly important in the higher accuracy converters which employ a large number of bits, since the required manufacturing accuracy generally varies exponentially with the number of bits. However, there are often few or no lead positions available for assignment specifically to trimming purposes. Accordingly, trimming has generally been performed before the packages are sealed and while the circuit elements are still directly accessible, leaving the devices open to the introduction of uncorrected errors during completion of the manufacturing process.

SUMMARY OF THE INVENTION

In view of the above problems associated with the prior art, the primary object of the present invention is the provision of means for accurately and selectably controlling adjustments to the operating characteristics of an electrical circuit device, and for doing so after manufacturing of the device has been completed so as to avoid subsequent unintentional alterations of the adjusted characteristics.

Another object is the provision of a circuit device such as a trimmable DAC with means for adjusting internal trim circuittry after the device has been completely packaged, but without requiring the use of any additional leads.

These and other objects are accomplished by employing existing device input leads in two modes: a first mode for normal operation in which input signals are within a first range, and a second mode in which a circuit for adjusting the device's operating characteristics is controlled by applying appropriate signals within a second range to selected combinations of leads. The two modes are segregated by making the first and second signal ranges mutually exclusive.

In an exemplary application of the invention to a trimmable DAC, the two modes are achieved by establishing a threshold signal level for the trimming mode which is greater than the level of digital input signals applied to the DAC during normal operation. A plurality of trimming elements are provided for each DAC bit circuit to be trimmed, with inclusion or exclusion of each trim element being controlled by a two-terminal actuating means. The terminals of each actuating means are connected in circuit with a unique pair of leads, permitting each trimming element to be included in the final trimming scheme by the application of appropriate signals to its associated lead pair.

In a preferred embodiment the actuating means each include a zener diode, and are arranged in groups with no more than one trimming element from each bit represented in each group. One side of all the zeners for each bit are connected in common, while the other side of the zeners for each group are also connected in common. Each common connection on the output side of the zeners is connected through a switch to a voltage bus of one polarity, while each common connection on the input side of the zeners is connected through another switch to a voltage bus of the opposite polarity. The voltage differential between the two buses is sufficient to break down the zeners and cause a permanent short circuit between their terminals by means of an avalanche metal migration process. The application of over-voltages to each individual zener is thus controlled by a unique pair of switches. Each switch in turn is controlled by a unique one of the leads, and completes a circuit between its associated zener and bus only when a voltage in excess of the bus voltage is applied to that lead.

Other features of the invention include the provision of the switches as transistors with associated threshold control devices to assure that the two modes of operation are segregated. A lockout device is also provided for the switches on one side of the zeners to prevent accidental adjustment of the trimming circuit after it has been established.

DESCRIPTION OF THE DRAWINGS

Further advantages and features of the invention will be apparent to those skilled in the art from the ensuing detailed description thereof, taken together with the accompanying drawings, in which:

FIG. 4 is a circuit diagram of a threshold control circuit for one set of switches shown in FIG. 3a.

DETAILED DESCRIPTION OF A PREFERRED EMBODIMENT

The invention may best be described with reference to an exemplary embodiment in which it is applied to a DAC. This embodiment should not, however, be taken to limit the scope of the invention, which extends in general to any electrical circuit device capable of being adjusted or modified by the application of appropriate signals from an adjustment circuit, which circuit in turn may be controlled by signals applied to the device's leads.

Figure 1:
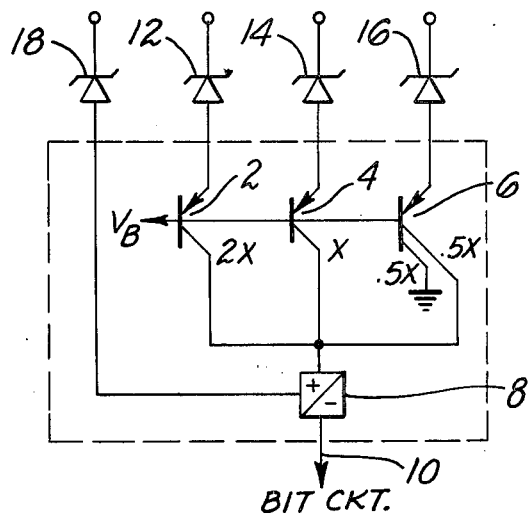
FIG. 1 is a circuit diagram of a trimming circuit, suitable for use in the present invention, which is adapted to adjust the output from one bit of a DAC.

A DAC employs a plurality of bit circuits capable of producing output currents of varying magnitudes, the total output being obtained by accumulating the individual outputs of a selected combination of bits. In order to increase the accuracy of the more critical bits, several different trimming schemes may be employed at various stages of manufacture to adjust the bit outputs. A preferred trimming arrangement for a single bit, which may be repeated for other bits for which trimming is desired, is shown in FIG. 1. The trimming circuit, shown enclosed in dashed lines, consists essentially of a plurality of separate elements, each of which makes a fixed contribution to the total trim signal. In the circuit shown, three of the elements comprise PNP transistors 2, 4, and 6, which are constructed such that a binary relationship is established among their current outputs. The weighting of each transistor is indicated in the diagram by an X scaling factor. The binary relationship is achieved by scaling the emitter geometries of transistors 2 and 4 such that the collector current of transistor 2 is double that for transistor 4, splitting the collectors of transistor 6 such that each collector carries half the current of transistor 4, and discarding the current from one of the collectors by grounding it. The transistors are biased by a common bias voltage $V_B$, and their collectors tied together to give a net trimming output. The remaining element comprises a direction control circuit 8 which receives the current output of transistors 2, 4, and 6 and determines whether the trimming current is to be added to or subtracted from the bit output. The final trimming current is delivered to the bit circuit over line 10, which originates in the sign control circuit 8.

In order to selectably actuate the various trimming elements, zener diodes 12, 14, 16 and 18 are connected in circuit respectively between each element and a positive voltage source (not shown) sufficient to produce the desired trimming current. By applying voltage differentials across selected zeners in excess of their breakdown voltage limits, permanent shorting can be induced. This causes the elements associated with the selected zeners to be actuated and contribute to the final trim signal delivered to the bit circuit. Specifically, breaking down and shorting zener 12 will produce a current from transistor 2 having a relative value of 4, while breaking down and shorting zeners 14 and 16 will produce currents from transistors 4 and 6 having relative values of 2 and 1, respectively. A trimming current with a relative magnitude of from 0 to 7 can thus be produced by breaking down and shorting selected combinations of zeners. Sign control circuit 8 draws current away from the bit circuit in response to its associated zener 18 being shorted, but directed trimming current toward the bit circuit when the zener remains intact.

Figure 2:
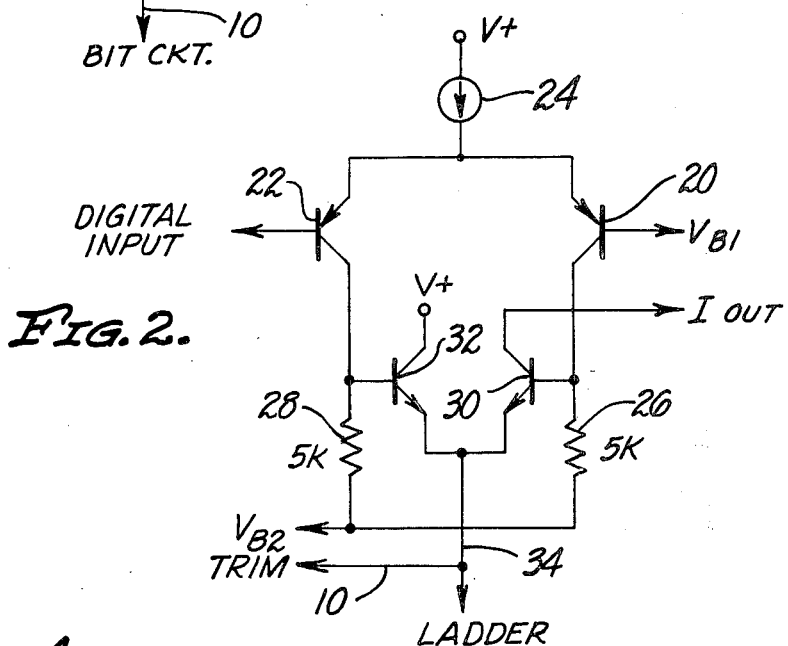
FIG. 2 is a circuit diagram of a DAC bit circuit to which a trimming signal from the circuit of FIG. 1 is applied.

Referring now to FIG. 2, the switching portion of a typical bit circuit of the well-known R-2R DAC ladder network is shown to illustrate the manner in which a trimming current from the circuit of FIG. 1 is integrated into the bit. A first differential switch, comprising a pair of transistors 20 and 22 biased respectively by a constant bias voltage $V_{B1}$ and by a portion of the digital input to the converter, routes the current output of a current source 24 between a pair of bias resistors 26 and 28 to set up a bias for transistors 30 and 32 of a second differential switch. Transistor 30 completes a circuit between the DAC output and the portion of the ladder network assigned to the bit when a digital input signal is present at the base of transistor 22, causing an output current to be produced by the bit. With no bias signal present at transistor 22, transistor 32 is actuated to disconnect the bit from the DAC output and connect it instead to a positive voltage supply bus V+. In either case, the bit output is transmitted from the ladder to the second differential switch over a line 34.

Trimming line 10 is connected to line 34 such that the selected trim signal either adds or subtracts from the bit output, as determined by sign control circuit 8. The final bit output can thus be adjusted by an appropriate selection of trimming elements. Further details of the preferred trimming circuit are set forth in copending patent application Ser. No. 768,328 referred to above, the contents of which are hereby incorporated by reference. This patent application also provides for an adjustment of the absolute magnitude of the trimming signals produced by each trim circuit, thereby enabling very fine trimming for DACs which are manufactured close to specifications, and coarser trimming for DACs which deviate more significantly from the nominal specifications.

Figure 3A:
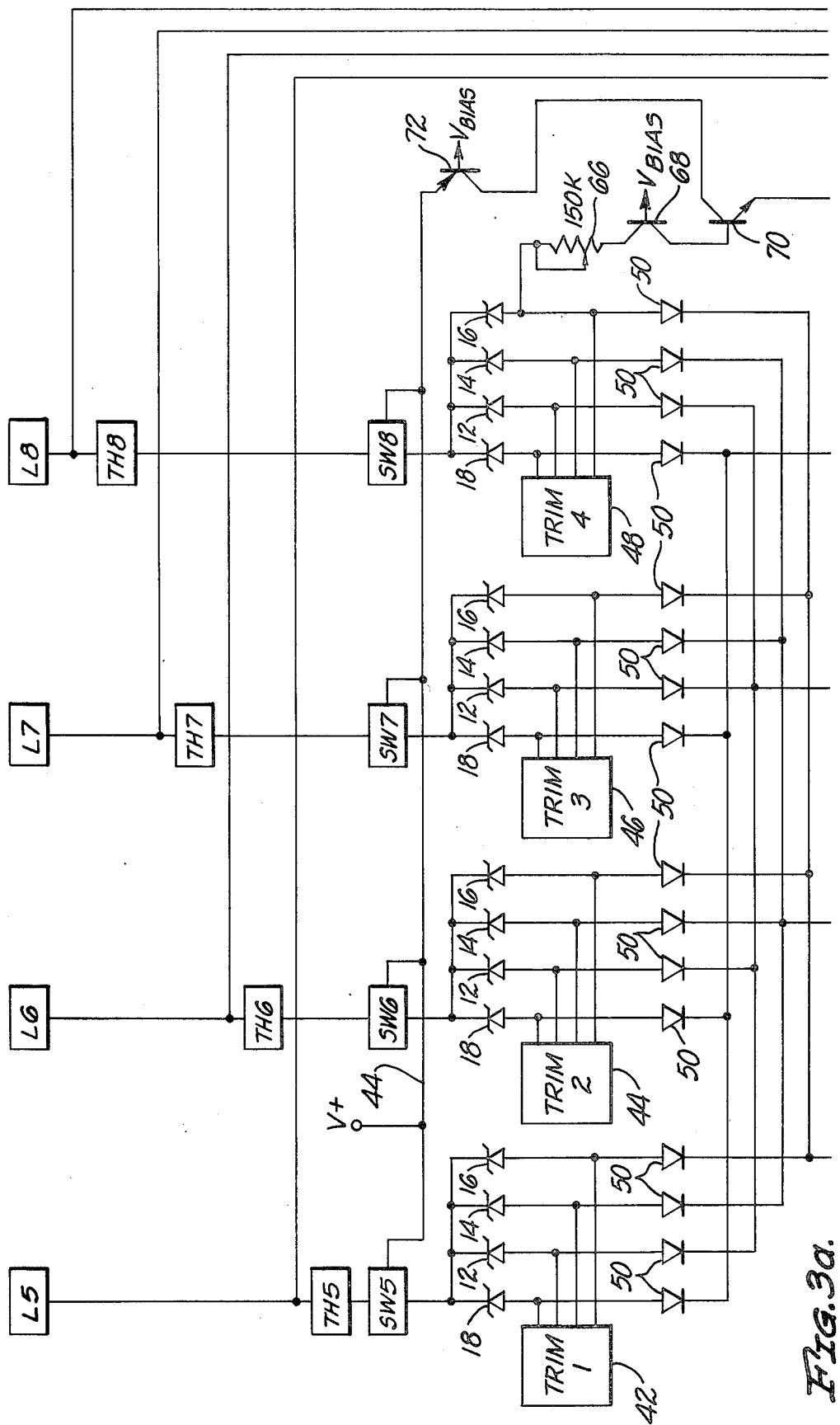
FIGS. 3a and 3b together comprise a circuit diagram, divided into two sheets, of a circuit constructed in accordance with the present invention for actuating desired portions of the trim circuits after the DAC package has been sealed and the trimming circuits protected from direct access.
Figure 3B:
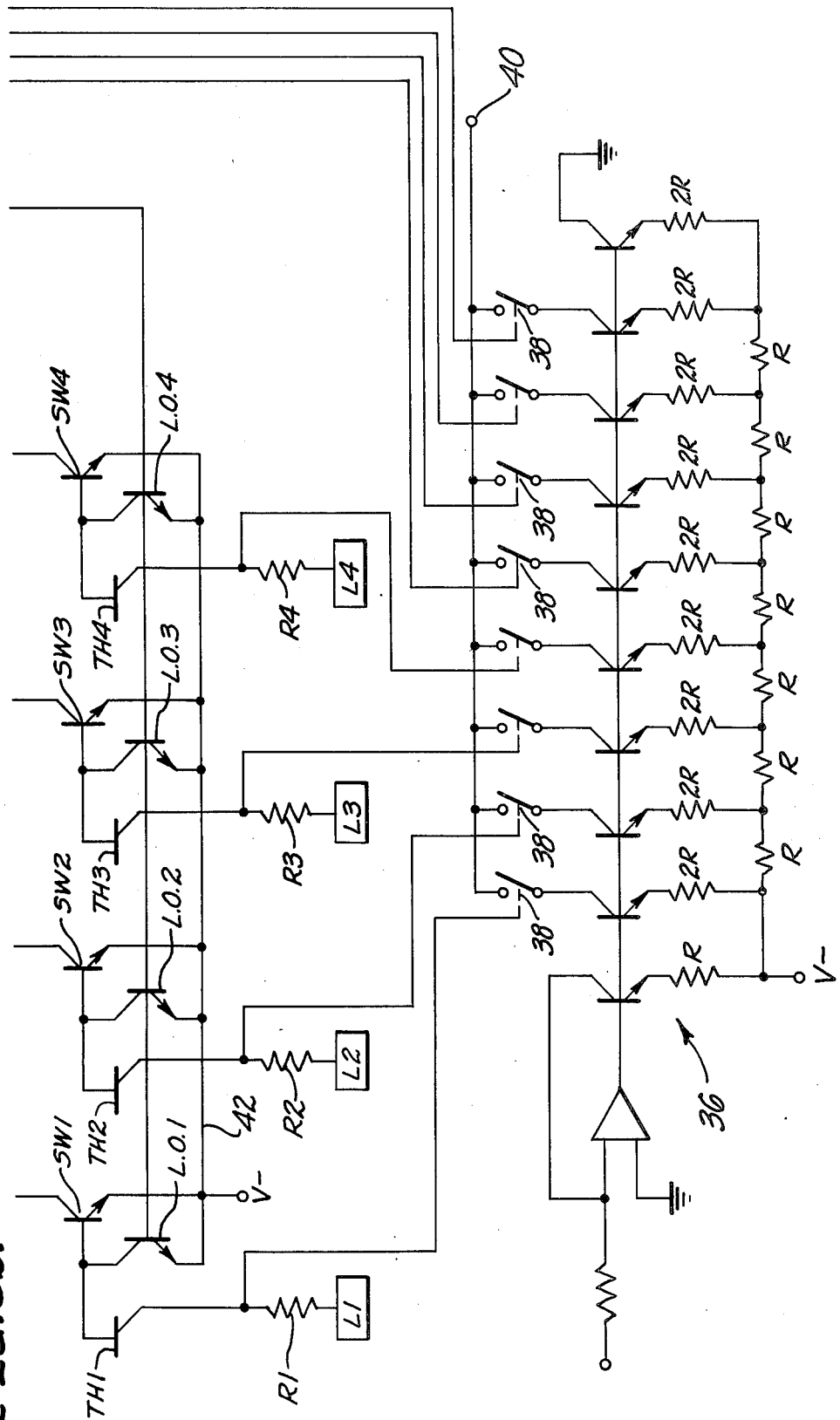

Referring now to FIGS. 3a and 3b, a circuit is shown which enables the selective breakdown of trimming actuators such as the zener diodes shown in FIG. 1, without requiring direct access to the zeners, and without requiring the addition of any extra leads not already in the DAC. Although zener diodes are used to actuate the trimming elements in the preferred embodiment, it should be understood that the circuit shown is applicable to other two-terminal switching devices, such as fuseable resistance links. An eight-bit DAC is shown to avoid unnecessary repetition, but it should be understood that the invention has even greater significance for larger devices, such as twelve-bit DACs, in which the accuracy and hence the trimming requirements are even more stringent. The illustrated DAC employs a ladder network of the usual R-2R configuration, with an amplifier circuit 36 providing a common bias for the various bits. Each bit includes a switch 38, having a design as shown in FIG. 2, for completing a circuit between the bit and a common output terminal 40. Switches 38 are operably connected to associated input leads labeled respectively L1–L8 for the first through eighth bits. The leads extend outwardly from the final sealed DAC package for insertion into a circuit board.

In the illustrative embodiment, provision is made for trimming four different bits by trimming circuits 42, 44, 46 and 48, labeled respectively TRIM 1–TRIM 4, each of which comprises a circuit having a plurality of trimming elements such as shown in FIG. 1. The trimming circuits are shown in block diagram form, with their associated zener diodes designated by the same reference numerals as in FIG. 1. The general approach of the present invention is to enable the breakdown of selected zeners and thereby the actuation of the trimming elements associated with those zeners, by the application of appropriate signals to leads L1–L8, which leads are also required for the introduction of digital signals to the DAC. Since sixteen zener trim element switches are employed with a total of thirty-two terminals, each of which must be supplied with an appropriate operating signal, it is apparent that the eight available leads are insufficient for one-on-one connections with the zeners. This problem is resolved by connecting each of the leads with one terminal of each of a plurality of zeners in a matrix whereby the terminal pair for each zener is connected in circuit with a unique pair of leads. With this approach the normal operating mode of the DAC must be segregated from a mode in which the trimming circuits are adjusted, in order to avoid unintentional adjustment of the trimming circuits when digital input signals are applied to the leads. An additional complication is presented by the fact that it is desirable to employ the same voltage supply buses to break down the selected zeners as are employed to establish the bit output current. These problems are resolved by interposing switching devices between the voltage supply buses and the zener diodes, the switches being operable by a relatively high voltage in excess of the digital input voltage level to complete breakdown circuits between the supply buses and the selected zener switching elements. The leads can thus be used in both an operating mode at digital input voltage levels, and in a trimming mode at high voltage levels to transmit signals to the various zener switching elements.

In FIGS. 3a and 3b, each of the leads L1–L4 controls the application of a negative voltage from negative supply bus 42 to the zener switch input terminals, while each of the remaining leads L5–L8 are connected to complete circuits between a positive voltage supply bus 44 and the zener output terminals. L1–L4 are each connected through current limiting resistors R1–R4 to respective threshold devices TH1–TH4, and also to ladder switches 38 of their respective bit circuits. The threshold devices TH1–TH4, preferrably implemented as the collector-base portions of lateral PNP transistors having breakdown voltage thresholds of about 80 volts, are connected to provide gating signals to the bases of respective NPN switching transistors SW1–SW4 when the voltage signals at their respective leads exceed their thresholds. The actuating zener diodes 12–18 for trim circuits 42–48 are arranged in groups of four, with only one zener from each trim circuit represented in each group. The collectors of switching transistors SW1–SW4 are connected to the input terminals of the zener diodes in each group, respectively, through isolating diodes 50 connected in series with each of the zeners. The input terminal of each zener is thus connected in circuit with one of the leads L1–L4, with the four zener switches for each trim circuit each being connected with different leads.

In a similar manner leads L5–L8, in addition to providing digital input transmission paths for their respective bit circuits, are each connected through respective threshold devices TH5–TH8 to the actuating control terminals of switches SW5–SW8. These switches in turn control the application of the voltage from positive supply bus 44 to the zener switch output terminals, which are connected in common for each trim circuit with a single one of switches SW5–SW8, thereby enabling the output side of the zeners for each trim circuit to be controlled by the same lead.

Figure 4:
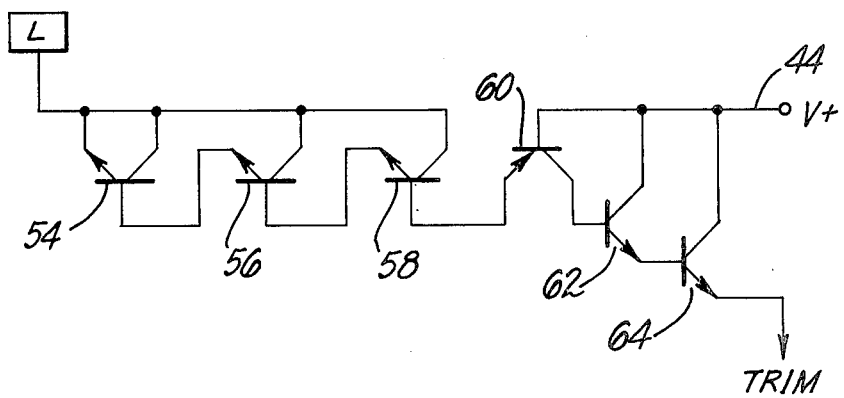

A circuit diagram of the threshold and switch devices associated with each of leads L5–L8 is shown in FIG. 4. Each threshold device comprises a plurality of NPN transistors 54, 56 and 58 connected in series such that three times the breakdown voltage of each individual transistor must be applied at the lead to break down the threshold circuit. The three transistors shown is arbitrary; the actual number employed would be determined by the desired operating voltages and the characteristics of each transistor. With NPN threshold transistors each having a breakdown voltage of about six volts, a voltage differential of at least 18 volts must be applied across the threshold circuit to produce an output signal at the base of transistor 58. The switching circuit includes a PNP transistor 60 having its emitter connected to the base of transistor 58, and its base biased by the positive supply bus voltage, typically 15 volts. A pair of switching transistors 62 and 64 are connected in stages to the collector of transistor 60, with transistor 64 providing a switch between the positive bus 44 and the zener switching elements of its associated trim circuit. It is gated into conduction by the appearance of a signal at the emitter of transistor 60 which exceeds the positive bus voltage and thereby brings that transistor into conduction, in turn gating transistors 62 and 64. With an 18 volt threshold control circuit and a 15 volt supply voltage, the lead voltage must exceed a threshold of 33 volts before a circuit between the positive supply voltage bus and the trimming circuit zener switches is completed.

Referring back to FIGS. 3a and 3b, it can thus be seen that the trimming circuit zener switch elements are connected with leads L1–L8 in a 4 × 4 matrix, which provides independent selection of any one of the 16 possible zener switch elements. Selected individual zener switch elements are broken down by providing a current path from their input terminals to the negative voltage supply bus and their output terminals to the positive voltage supply bus. For each zener element a circuit connection with the negative bus is controlled by one of leads L1–L4, and with the positive bus by one of leads L5–L8. Each zener is thus selectable with a unique pair of leads, permitting that zener and none other to be broken down by applying greater-than-threshold voltages at its associated leads. For example, it can be seen from inspecting the figure that zener 18 of the second trimming circuit 44 is broken down by applying appropriate voltage signals to leads L4 and L6, while zener 14 of the third trimming circuit 46 is associated with leads L2 and L7.

An additional feature of the invention provides a mechanism for preventing the trim circuits from being inadvertently changed once the desired combination of zeners have been shorted and a trimming pattern established. For this purpose one of the zener elements associated with the trimming circuit for the least significant trimmed bit is allocated to a lockout circuit. In the circuit shown, this is zener 16 of trimming circuit 48. The input terminal of this zener is connected through a pinch resistor 66 to the emitter of a PNP transistor 68, biased at a constant voltage less than the voltage transmitted to its emitter from the positive bus via zener 16. Transistor 68 when gated gates another transistor 70 to complete a lockout circuit from the positive bus, through a current source transistor 72, to the bases of lockout transistors L.0.1–L.0.4. The latter transistors are connected between the bases and emitters of switching transistors SW1–SW4, respectively. With transistor 70 conducting, they are driven into saturation by the current from source 72, diverting any signals that may thereafter be applied to leads L1–L4 away from the bases of their associated switching transistors. This prevents the completion of a breakdown circuit for any of the zeners, even in the event voltages exceeding the threshold level are subsequently applied to a pair of leads.

With a digital input signal level of 5 volts, a voltage level of about 80 volts is preferrably used in the trimming mode. It should be noted that the higher voltage level is applied not only to the trimming circuitry, but also to the bases of transistors 22 in the switching circuit for each bit. In order to withstand voltages in this range, transistors 22 are provided as lateral PNPs. It should also be noted that the resistors R1–R4 are chosen of a sufficient value to limit the current delivered to threshold control diodes TH1–TH4 to a level at which these diodes break down, but do not burn out under a trimming control voltage of 80 volts applied to their respective leads. This is an important feature since each of the threshold diodes is connected in circuit with a plurality of zener switching elements, and repeated trimming control signals would be applied to the diode through its associated lead if selection of more than one of its associated zener switching elements is desired.

While four trimming circuits with four elements each are shown for purposes of illustration, the invention is not limited to such a configuration. More bits could be trimmed with fewer trimming elements per bit, or fewer bits could be trimmed with a greater range of elements per bit. In general, the only limitation on these numbers is that the total of the number of trimming elements exceed the total number of selections possible for a given number of inputs. Also, the invention provides a degree of automatic compensation for the higher resolutions required in higher order DACs. The trimming resolution for each bit varies in a positive manner with the number of elements per bit. In a twelve-bit DAC, resolution is more critical than with the eight-bit DAC shown. This additional resolution is achieved within the confines of the present invention because, by keeping the proportion of trimmed to untrimmed bits constant, the number of trimming elements that may be employed per trimmed bit increases directly with the number of bits. Thus, half the bits of a twelve-bit DAC may be trimmed with six trimming elements per bit, rather than only four elements per bit as in the illustrated DAC. With a binary relationship existing between element outputs, this permits the trimming resolution for the most significant bit of a twelve-bit DAC to be increased by a factor of four over the resolution attainable for the corresponding bit of an eight-bit DAC.

While a particular embodiment of the invention has been shown and described, numerous additional modifications and variations are possible in light of the above teachings. It is therefore intended that the scope of the invention be limited only in and by the terms of the appended claims.

What is claimed is:

1. In a digital to analog converter having a plurality of bit circuits, and a corresponding plurality of leads for transmitting input digital voltage signals below a predetermined threshold level to said bit circuits, at least some of said bit circuits each having an associated plurality of selectable trimming elements, wherein the improvement comprises:

a two-terminal actuating means for each of said elements, each actuating means being operable in response to a pair of gating voltage signals in excess of said threshold level applied to its terminals, and means connecting the terminals of each actuating means in circuit respectively with a unique pair of leads, said leads providing gating signal paths enabling the selection of a trim signal for each bit circuit by applying gating signals to those lead pairs which are connected to the actuating means for the desired combination of elements, said bit circuits being capable of withstanding gating voltages applied at their respective leads, and a positive voltage bus connected in circuit with each of said actuating means to supply an actuating signal to said trimming elements when said actuating means are operated, said bus also being connected to supply an operating voltage to said bit circuit.

2. In a digital to analog converter having a plurality of bit circuits, a corresponding plurality of leads for transmitting input digital voltage signals to said bit circuits, and one or more trimming elements associated with each of at least some of said bit circuits for providing trimming signals thereto, wherein the improvement comprises:

actuating means for each of said trimming elements, each of said actuating means being operable by a gating voltage signal equal to or exceeding a predetermined threshold voltage level, said threshold voltage level being greater than the input digital signal level, said bit circuits being capable of withstanding the gating voltage levels, and means connecting each actuating means with a unique combination of leads, whereby said leads may be employed in both an operating mode to transmit input digital signals to their associated bit circuits, and a trimming mode to transmit gating signals to their associated actuating means, the lead combination for each actuating means comprising a pair of leads and including positive and negative voltage supply buses adapted to support voltages having a differential sufficient to actuate said trimming elements, each of said actuating means including a pair of switch means connected between its associated trimming element and said buses, one of said switch means being connected with one and the other of said switch means being connected with the other of the leads in the lead pair associated with said element, said switch means being operable by voltage signals on their respective leads equal to or exceeding said threshold voltage level.

3. In a digital to analog converter having a plurality of bit circuits, and a corresponding plurality of leads for transmitting input digital voltage signals below a predetermined threshold level to said bit circuits, at least some of said bit circuits each having an associated plurality of selectable trimming elements, wherein the improvement comprises:

a two-terminal actuating means for each of said elements, each actuating means being operable in response to a pair of gating voltage signals in excess of said threshold level applied to its terminals, means connecting the terminals of each actuating means in circuit respectively with a unique pair of leads, said leads providing gating signal paths enabling the selection of a trim signal for each bit circuit by applying gating signals to those lead pairs which are connected to the actuating means for a desired combination of elements, said bit circuits being capable of withstanding gating voltages applied at their respective leads, for each trimmed bit circuit, first terminals of each of the trimming element actuating means for said bit being connected in circuit with a common lead, and second terminals of each of said actuating means being connected in circuit with different leads, the actuating means for the trimming elements of the various bit circuits being arranged in groups, with no more than one trimming element from each bit circuit represented in each group, the second terminals of the actuating means for each group being connected in circuit with a common lead, and Each of said actuating means including a zener diode interfacing with its associated trimming element.

4. The digital to analog converter of claim 3, said first and second actuating means terminals being connected in circuit respectively with the output and input terminals of said zener diodes.

5. Apparatus comprising an electrical circuit device, and a plurality of leads connected to said device for providing electrical communication therewith, said device being adapted to operate in response to the application of voltage signals within a first signal range to said leads, the signal level of said first signal range being below a predetermined threshold level, the improvement comprising means for adjusting the operating characteristics of said device, comprising:

selectably actuable adjustment circuit means having a plurality of input terminals associated therewith and being electrically connected to said device to adjust the operating characteristics thereof, said circuit means being adapted to operate in response to the application of actuating voltage signals within a second signal range to its input terminals, the signal level of said second signal range being greater than or equal to said threshold level, whereby said first and second signal ranges are mutually exclusive, and at least some of said leads being connected to respective input terminals of said adjustment circuit means to transmit actuating signals thereto, thereby enabling said leads to be employed in both an operating mode when applied signals are within said first range, and an adjustment mode when applied signals are within said second range, said adjustment circuit means comprising a plurality of adjustment signal generating means and a corresponding plurality of two-terminal actuating means associated respectively with each of said signal generating means, each of said actuating means being adapted to actuate its associated adjustments signal generating means in response to the application of signals at its terminals within said second range, the terminals of each actuating means being connected to a unique pair of leads, thereby enabling a desired adjustment to be made by applying signals within said second range to selected leads.

6. Apparatus according to claim 5, said actuating means being arranged in groups, the first terminal of each actuating means within a group being connected in common with the other first actuating means terminals of said group to the same lead, and each of the second terminals of the actuating means within a group being connected to different leads.

7. Apparatus according to claim 5, wherein each of said actuating means comprises a switch means controlling the application of a signal from its associated adjustment signal generating means to said circuit device.

8. Apparatus according to claim 7, said switch means comprising zener diodes.

9. In a digital to analog converter having a plurality of bit circuits, and a corresponding plurality of leads for transmitting input digital signals below a predetermined threshold level to said bit circuits, at least some of said bit circuits each having an associated plurality of selectable trimming elements, wherein th improvement comprises:

a two-terminal actuating means for each of said elements, each actuating means being operable in response to a pair of gating voltage signals in excess of said threshold level applied to its terminals, and means connecting the terminals of each actuating means in circuit respectively with a unique pair of leads, said leads providing gating signal paths enabling the selection of a trim signal for each bit circuit by applying gating signals to those lead pairs which are connected to the actuating means for the desired combination of elements, said bit circuits being capable of withstanding gating voltages applied at their respective leads, first terminals of each of the trimming element actuating means being connected in circuit with a common lead, and second terminals of each of said actuating means being connected in circuit with different leads, the actuating means for the trimming elements of the various bit circuits being arranged in groups, with no more than one trimming element from each bit circuit represented in each group, the second terminals of the actuating means for each group being connected in circuit with a common lead, each of said actuating means including a zener diode interfacing with its associated trimming element, said first and second actuating means terminals being connected in circuit respectively with the output and input terminals of said zener diodes, and a negative voltage bus, each of said groups including a separate switch means connected to complete a circuit between said bus and the input terminals of zener diodes of said group, each switch means each being operable in response to a signal exceeding the threshold level being transmitted over the lead for its associated group, and further including means for permanently disabling each of said switch means to prevent accidental actuation thereof after the desired trimming pattern has been established.

10. The digital to analog converter of claim 9, each of said switch means comprising an NPN transistor, and said disabling means comprising the combination of a lockout transistor connecting the base and emitter of said NPN transistor, and means for transmitting a saturating signal to said lockout transistor.

11. The digital to analog converter of claim 10, wherein said means for transmitting a saturating signal to said lockout transistor includes one of said actuating means, the zener diode of said actuating means being disassociated from the trimming elements.

12. In a digital to analog converter having a plurality of bit circuits, and a corresponding plurality of leads for transmitting input digital signals below a predetermined threshold level to said bit circuits, at least some of said bit circuits each having an associated plurality of selectable trimming elements, wherein the improvement comprises:

a two-terminal actuating means for each of said elements, each actuating means being operable in response to a pair of gating voltage signals in excess of said threshold level applied to its terminals, and means connecting the terminals of each actuating means in circuit respectively with a unique pair of leads, said leads providing gating signal paths enabling the selection of a trim signal for each bit circuit by applying gating signals to those lead pairs which are connected to the actuating means for the desired combination of elements, said bit circuits being capable of withstanding gating voltages applied at their respective leads, first terminals of each of the trimming element actuating means being connected in circuit with a common lead, and second terminals of each of said actuating means being connected in circuit with different leads, the actuating means for the trimming elements of the various bit circuits being arranged in groups, with no more than one trimming element from each bit circuit represented in each group, the second terminals of the actuating means for each group being connected in circuit with a common lead, each of said actuating means including a zener diode interfacing with its associated trimming element, and further including positive and negative voltage buses adapted to support a voltage differential sufficient to break down and permanently short said zener diodes, and a plurality of first and second switch means, said first switch means being connected respectively in switching circuits between one of said voltage buses and the first actuating terminals for the respective bit circuits, the common lead for each bit circuit providing a control circuit for the first switch means associated with that bit circuit, said second switch means being connected respectively in switching circuits between the other voltage bus and a common connection for the second actuating terminals of the respective groups of zener diodes, the common lead for each group providing a control circuit for the second switch means associated with said group, each of said switch means being operable in response to a signal exceeding the threshold level aplied at its associated lead.

13. The digital to analog converter of claim 12, said switch means comprising switching transistors, the lead associated with each switching transistor providing a path for transmitting a gating voltage thereto, and further including threshold control circuit means interposed between said leads and their associated switching transistors to increase the lead voltages necessary to gate the switching transistors to a level greater than the gating voltages of said transistors.

14. The digital to analog converter of claim 13, said threshold control circuit means comprising at least one zener diode connected in circuit between each of said switching transistors and its associated lead.

15. The digital to analog converter of claim 14, and further including current limited means connected between said threshold circuit zener diodes and their associated leads, said means limiting the current delivered through said diodes in response to actuating signals at said leads to a level sufficient to break down but insufficient to burn out said zener diodes, thereby permitting multiple operation of said switching transistor.

16. The digital to analog converter of claim 13, and further including means for locking the switching transistors for one of said voltage buses in a nonconductive mode, and thereby preventing further selection of trimming elements.

17. The digital to analog converter of claim 16, wherein each of the transistors for switching the negative voltage bus comprise NPN devices, and said lockout means comprise lockout transistors connected respectively between the bases and emitters of said NPN transistors, and a selectable actuating circuit for said lockout transistors.

* * * * *

UNITED STATES PATENT AND TRADEMARK OFFICE
CERTIFICATE OF CORRECTION

PATENT NO. : 4,131,884
DATED : Dec. 26, 1978
INVENTOR(S) : Donald T. Comer

It is certified that error appears in the above-identified patent and that said Letters Patent are hereby corrected as shown below:

Col. 12, line 39, change "limited" to "limiting".

Signed and Sealed this

First Day of May 1979

[SEAL]

Attest:

RUTH C. MASON
Attesting Officer

DONALD W. BANNER
Commissioner of Patents and Trademarks